(12) United States Patent
Goodno et al.

(10) Patent No.: US 11,411,366 B2
(45) Date of Patent: Aug. 9, 2022

(54) COMBINED LASER ARCHITECTURE USING WAVELENGTH MULTIPLEXED SEED SOURCE

(71) Applicant: NORTHROP GRUMMAN SYSTEMS CORPORATION, Falls Church, VA (US)

(72) Inventors: Gregory D. Goodno, Los Angeles, CA (US); Eric C. Cheung, Rancho Palos Verdes, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 785 days.

(21) Appl. No.: 16/248,487

(22) Filed: Jan. 15, 2019

(65) Prior Publication Data

US 2020/0227883 A1 Jul. 16, 2020

(51) Int. Cl.
*H01S 3/23* (2006.01)
*H01S 3/107* (2006.01)
(Continued)

(52) U.S. Cl.
CPC ........ *H01S 3/2316* (2013.01); *H01S 3/06758* (2013.01); *H01S 3/08004* (2013.01);
(Continued)

(58) Field of Classification Search
None
See application file for complete search history.

(56) References Cited

U.S. PATENT DOCUMENTS 5,515,196 A * 5/1996 Kitajima ............. G02F 1/01708
                                                          398/185
9,106,051 B1 * 8/2015 Goodno ................ H01S 3/0085
                        (Continued)

FOREIGN PATENT DOCUMENTS

WO       2015164082 A1    10/2015

OTHER PUBLICATIONS

Rothenberg, Joshua E., Brown, Donald F. and Wilcox, Russell B.; "The issue of FM to AM conversion on the National Ignition Facility"; SPIE vol. 3492—0277-786X-99; pp. 51-61.
(Continued)

*Primary Examiner* — Eric L Bolda
(74) *Attorney, Agent, or Firm* — John A. Miller; Shumaker, Loop & Kendrick, LLP

(57) ABSTRACT

A WDM seed beam source for a fiber laser amplifier system that includes a number of master oscillators that generate seed beams at different wavelengths and a spectral multiplexer that multiplexes all of the seed beams onto a single fiber. An EOM modulates the combined seed beams on the single fiber and a spectral demultiplexer then separates the modulated seed beams into their constituent wavelengths on separate fibers before the seed beams are amplified and spectrally combined. The fiber laser amplifier system includes a separate fiber amplifier that amplifies the separated seed beams, an emitter array that directs the amplified beams into free space, beam collimating optics that focuses the uncombined beams, and an SBC grating responsive to the collimated uncombined beams that spatially combines the collimated uncombined beams.

21 Claims, 3 Drawing Sheets

(51) Int. Cl.
*H01S 3/08* (2006.01)
*H01S 3/067* (2006.01)
*H01S 3/0941* (2006.01)
*H01S 3/094* (2006.01)

(52) U.S. Cl.
CPC ...... *H01S 3/08013* (2013.01); *H01S 3/08054* (2013.01); *H01S 3/08086* (2013.01); *H01S 3/09415* (2013.01); *H01S 3/094053* (2013.01); *H01S 3/107* (2013.01); *H01S 3/2383* (2013.01); *H01S 3/2391* (2013.01)

(56) References Cited

U.S. PATENT DOCUMENTS

| | | | |
|---|---|---|---|
| 10,008,821 B1 | 6/2018 | Goodno et al. | |
| 2012/0212802 A1* | 8/2012 | Rothenberg | H01S 3/06754 |
| | | | 359/341.1 |
| 2019/0305504 A1* | 10/2019 | Goodno | H01S 3/10015 |
| 2019/0305505 A1* | 10/2019 | Goodno | H01S 3/10053 |
| 2020/0241383 A1* | 7/2020 | Goodno | H01S 3/2391 |

OTHER PUBLICATIONS

Waxer, L.J., Kelly, J.H., Rothenberg, J., Babushkin, A., Bibeau, C., Bayramian, A. and Payne, S.; "Precision spectral sculpting for narrow-band amplification of broadband frequency-modulated pulses"; Optic Letters; 2002 Optical Society of America; Aug. 15, 2002; vol. 27, No. 16; pp. 1427-1429.

* cited by examiner

COMBINED LASER ARCHITECTURE USING WAVELENGTH MULTIPLEXED SEED SOURCE

BACKGROUND

Field

This disclosure relates generally to a wavelength division multiplexing (WDM) seed beam source for a fiber laser amplifier system that employs a plurality of beam channels that generate amplified beams at different wavelengths that are combined by spectral beam combining (SBC) and, more particularly, to a WDM seed beam source for a fiber laser amplifier system that employs a plurality of beam channels that generate amplified beams at different wavelengths that are combined by SBC, where the seed beam source includes a multiplexer for multiplexing all of the seed beams onto a single fiber, an electro-optic modulator (EOM) that modulates the combined seed beams on the fiber and a demultiplexer for separating all of the modulated seed beams onto separate fibers before the seed beams are amplified and spectrally combined.

Discussion

High power laser amplifiers have many applications, including industrial, commercial, military, etc. One specific example for high power lasers is laser weapons systems. Designers of laser amplifiers are continuously investigating ways to increase the power of the laser amplifier for these and other applications. One known type of laser amplifier is a fiber laser amplifier that employs a doped fiber that receives a seed beam and a pump beam to amplify the seed beam and generate the laser output beam, where the fiber typically has an active core diameter of about 10-20 µm.

Improvements in fiber laser amplifier designs have increased the output power of the fiber amplifier to approach its practical power and beam quality limit. To further increase the output power some fiber laser systems employ multiple fiber laser amplifiers that combine the amplified beams in some fashion to generate higher powers. A design challenge for fiber laser amplifier systems of this type is to combine the beams from a plurality of fiber amplifiers in a manner so that the beams provide a single beam output having a uniform phase over the beam diameter such that the beam can be focused to a small focal spot. Focusing the combined beam to a small spot at a long distance (far-field) defines the quality of the beam.

In one multiple fiber laser amplifier design known as spectral beam combining (SBC), a plurality of master oscillators (MOs) generate a plurality of fiber seed beams at different wavelengths, where each fiber seed beam is amplified. The amplified fiber seed beams are then directed to a diffraction grating, or other wavelength-selective element, that combines the different wavelength fiber beams into a single output beam. The diffraction grating has a periodic structure formed into the element so that when the individual fiber beams each having a slightly different wavelength and angular direction are redirected by the periodic structure all of the beams diffract from the diffraction grating in the same direction. However, limitations on spectral brightness limit the number of seed beams that can be wavelength-combined, thus limiting the output power of the laser.

SBC is a one method for scaling laser sources to weapons-class brightness, for example, greater than the 100 kW level. As mentioned, SBC laser weapons systems typically employ a dispersive optic, such as a diffraction grating, that combines beams from multiple high power laser channels, such as Yb-doped fiber amplifiers (YFDAs), although any laser elements can be used. Because of the limited gain bandwidth of the lasing gain medium (e.g. ~40 nm accessible gain bandwidth for YDFAs), the laser beam source channels must be configured to provide high spectral brightness (kW/nm) in order to scale an SBC system to high power while maintaining good combined beam quality, which due to angular dispersion from the grating will be degraded if the channel linewidths are not relatively narrow.

In order to achieve high spectral brightness from a YDFA, it is necessary to seed the amplifier with low power, narrow linewidth light. However, two nonlinear impairments in the YDFA constrain the seed beam characteristics. First, stimulated Brillouin scattering (SBS) requires that the seed beam linewidth be broadened to decrease its coherence length, and thus increase the SBS power threshold. Second, the Kerr nonlinearity imposes a requirement that the seed beam exhibit low relative intensity noise (RIN) to prevent unwanted nonlinear spectral broadening via self-phase modulation (SPM) or cross-phase modulation (XPM) in the YDFA.

These two nonlinear impairments typically require an SBC system architecture having a plurality of channels, where each laser channel includes a low power master oscillator front end assembly (MOFEA) and a high power YDFA (or chain of YDFAs), whose output beams are combined using beam combining optics into a single beam. Each MOFEA includes a master oscillator (MO) that typically is a single-longitudinal mode distributed feedback (DFB) diode laser oscillator that is followed by an electro-optic modulator (EOM). The EOM changes the phase of the seed beam proportionally to an applied voltage. By applying a radio frequency (RF) source with high power to the EOM, the output beam will have its linewidth substantially broadened compared to the input seed beam. Typical values for linewidth broadening suitable to seed kW-class YDFAs without SBS impairments are on the order of ~10 GHz/kW. The linewidth-broadened seed beam will ideally exhibit zero RIN, since only its phase is modulated and not its amplitude. This prevents spectral broadening, and consequent loss of beam quality of the combined SBC beam, by avoiding SPM or XPM in the YDFA.

For air and land platforms in particular, the size, weight and power (SWaP) of the fiber laser system is a major factor limiting deployment and use. In particular, the MOFEA suffers from a high part count and consequent high cost. While there is certainly opportunity for more compact packaging and routing of components, the requirement for parallel high power RF sources and EOMs for the multiple channels is a significant contributor to both SWaP and the cost of the MOFEA. There is a need for architectural and component improvements that would enable a reduction in the SWaP and cost of MOFEAs used for SBC laser beam sources.

SUMMARY

This disclosure discusses and describes a WDM seed beam source for a fiber laser amplifier system that includes a number of master oscillators that generate seed beams at different wavelengths and a spectral multiplexer that multiplexes all of the seed beams onto a single fiber. A single electro-optic modulator (EOM) modulates the combined seed beams on the single fiber and a spectral demultiplexer then separates the modulated seed beams into their constituent wavelengths on separate fibers before the seed beams are amplified and spectrally combined. The fiber laser amplifier system includes a separate fiber amplifier that amplifies the separated seed beams, an emitter array responsive to all of the separate amplified beams that directs the amplified beams into free space as diverging uncombined beams, beam collimating optics responsive to the diverging uncombined beams that focuses the diverging uncombined beams as collimated uncombined beams, and an SBC grating responsive to the collimated uncombined beams that spatially combines the collimated uncombined beams so that all of the amplified beams at the different wavelengths are directed in the same direction as an output beam.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a wavelength division multiplexing (WDM) seed beam source for a fiber laser amplifier system that employs spectral beam combining (SBC) is merely exemplary in nature, and is in no way intended to limit the disclosure or its applications or uses.

Figure 1:
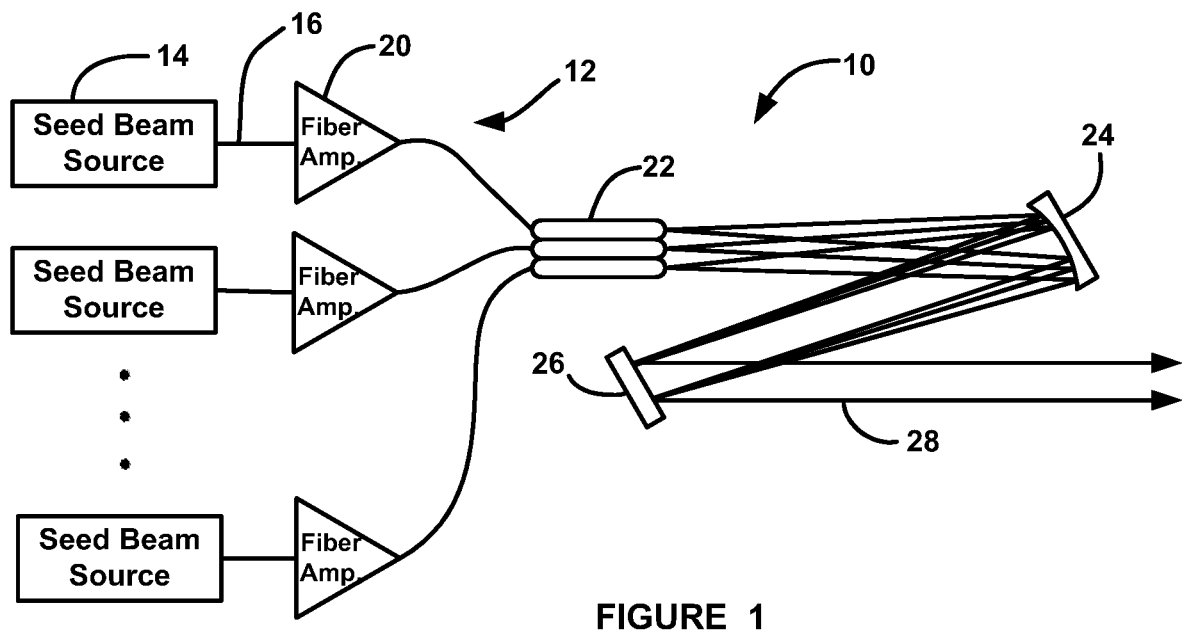
FIG. 1 is a schematic diagram of a known SBC fiber laser amplifier system including multiple wavelength channels.

FIG. 1 is a schematic block diagram of a known SBC fiber laser amplifier system 10 that includes N number of wavelength channels 12 each having a seed beam source 14 that generates a seed beam provided on a fiber 16 at a particular wavelength $\lambda$, where each seed beam source 14 generates a different beam wavelength $\lambda_1$-$\lambda_N$. Each of the seed beams on the fibers 16 is sent to a fiber amplifier 20, such as a Yb-doped fiber amplifier, where the amplifier 20 will typically be a doped amplifying portion of the fiber 16 that receives an optical pump beam (not shown). All of the amplified beams are directed to an optical emitter array 22 that outputs a set of diverging amplified beam into free space, where the individual beam wavelengths $\lambda_1$-$\lambda_N$ are propagating from slightly different emitter positions. The diverging beams are reflected off of collimating optics 24 that collimates the diverging beams and directs them onto a spectral beam combining (SBC) grating 26 so that all of the individual beams impact the grating 26 and overlap on the same footprint. The grating 26 spatially diffracts the individual beam wavelengths $\lambda$ and directs the individual amplified beams in the same direction as a combined output beam 28.

Figure 2:
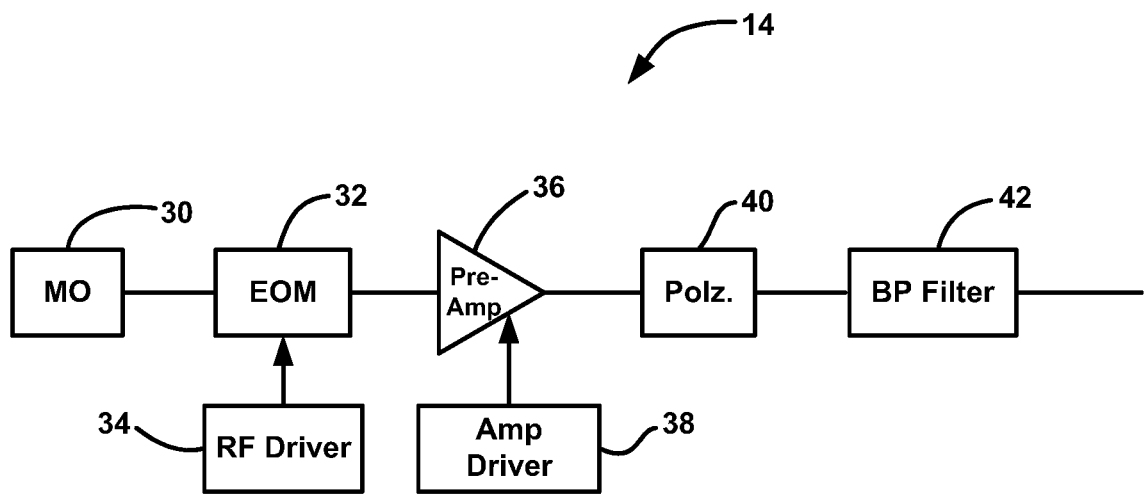
FIG. 2 is a schematic block diagram of a seed beam source in one of the channels in the SBC fiber laser amplifier system shown in FIG. 1.

FIG. 2 is a schematic block diagram of one of the seed beam sources 14 for one of the channels 12, where other seed beam sources having other variations of components could also be used. Each seed beam source 14 includes a master oscillator (MO) 30 that generates a continuous wave single frequency beam having the wavelength $\lambda$ of the particular channel 12. In one embodiment, the MO 30 can be a single-longitudinal mode distributed feedback (DFB) diode laser oscillator. The seed beam generated by the MO 30 is sent to an electro-optic modulator (EOM) 32 that changes the phase of the seed beam to be proportional to an applied voltage provided by an amplified radio frequency (RF) electrical driver 34 with high power so that the output seed beam has a linewidth that is substantially broadened compared to the input seed beam, which suppresses stimulated Brillouin scattering in the downstream high power fiber amplifier 20. One or more low power (typically ~10-100 mW) pre-amplifiers 36 that are driven by an amplifier driver 38 receives the broadened seed beam, where the pre-amplifier 36 can be either a semiconductor optical amplifier (SOA) or a fiber amplifier, so as to boost the beam power to levels suitable to seed the high power fiber amplifier 20. One or more clean-up polarizers 40 filter out depolarized power introduced by imperfections in the upstream components to ensure a high polarization extinction ratio (PER). An optical bandpass filer 42 reduces amplified stimulated emission from the MO 30 and/or from the pre-amplifier 36.

As discussed above, especially for air and land laser system platforms, the size, weight and power (SWaP) of the laser system is a major factor limiting deployment and use. Since all of the parallel seed beam sources 14 include all of the components shown in FIG. 2, the system suffers from a high part count and consequent high cost. The requirement for parallel high power RF sources and EOMs is a significant contributor to both SWaP and the cost of the seed source.

Figure 3:
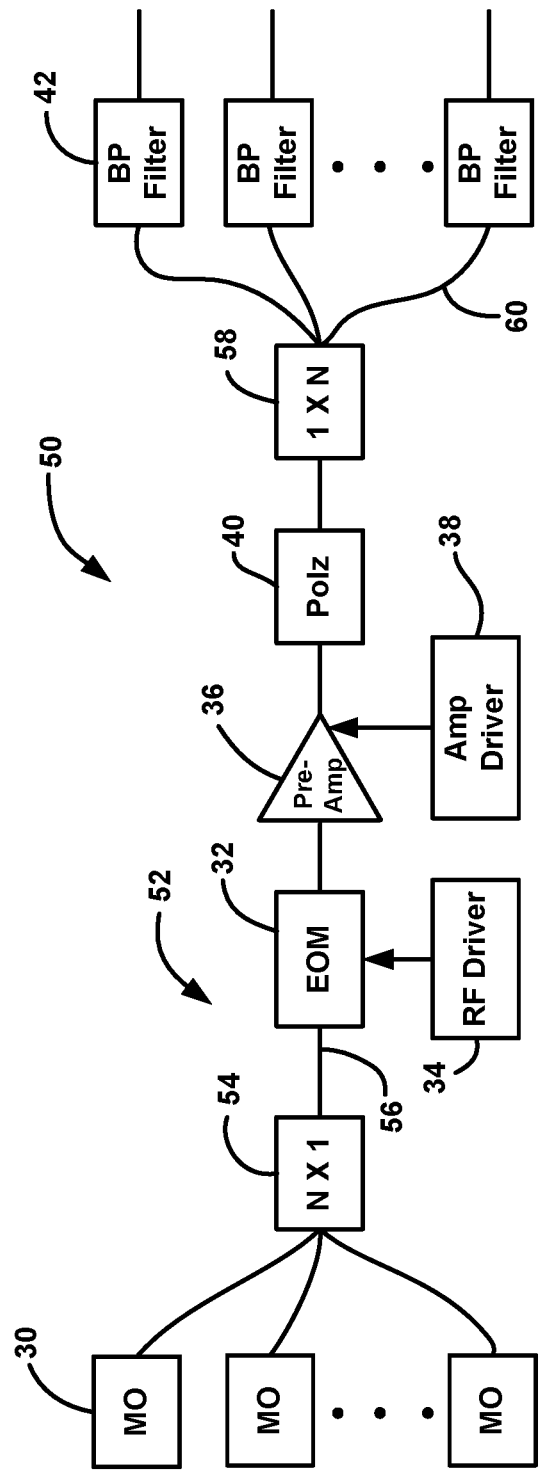
FIG. 3 is a schematic block diagram of a WDM seed beam source that can replace all of the seed beam sources of the type shown in FIG. 2 required for an SBC fiber laser amplifier system of the type shown in FIG. 1.

FIG. 3 is a schematic block diagram of a wavelength division multiplexing (WDM) seed beam source 50 that provides multiple seed beams at different wavelengths $\lambda_1$-$\lambda_N$ that can replace all of the seed beam sources 14 of the type shown in FIG. 2 for an SBC fiber laser amplifier system of the type shown in FIG. 1, where like elements to the seed beam source 14 are identified by the same reference number. In the seed beam source 50, the N beam channel wavelengths $\lambda_1$-$\lambda_N$ from all of the MOs 30 are combined in a single modulation channel 52 that has one EOM 32, one RF driver 34, one pre-amplifier 36, one amplifier driver 38 and one polarizer 40. To accomplish this, the seed beams from all of the MOs 30 are sent to a spectral multiplexer 54 that multiplexes all of the wavelengths $\lambda_1$-$\lambda_N$ of the seed beams onto a single fiber 56, where the combined seed beams are then sent to the EOM 32 to be modulated in the manner discussed above, then amplified by the pre-amplifier 36 and then polarization filtered by the polarizer 40. The combined seed beams from the polarizer 40 is sent to a spectral demultiplexer 58 that separates the different wavelength $\lambda_1$-$\lambda_N$ seed beams into separate fibers 60 before being sent to the bandpass filter 42 and then to the fiber amplifier 20. Thus, N−1 EOMs, noise drivers, pre-amplifiers, amplifier drivers, and polarizers can be eliminated from the known design.

The spectral multiplexer 54 and the spectral demultiplexer 58 can be any suitable wavelength division device for the purposes discussed herein. One technique is to simply use fiber splitters, which are cheap and commercially available. However, fiber splitters are very lossy since only 1/N of the input power will be successfully transmitted into the output channels. Moreover, at the demultiplexer end of the seed beam source the use of splitters imposes tight requirements on the bandpass filters 42 of ~−50 dB blocking of adjacent wavelengths to meet crosstalk requirements imposed by the high power amplifier 20. Due to the high loss, a higher power amplifier may need to be used in place of a single pre-amplifier 36. An alternate approach with lower loss could be to use a wavelength-dependent element. For example, this could comprise a series of add-drop filters based on fiber Bragg gratings, or an arrayed waveguide grating (AWG), or a programmable spectral filter with multiple switchable output fibers. These are common solutions in the telecom wavelength band (~1550 nm). Since the spectral filter is programmable, it provides great flexibility in channel tuning and configuration. It can be configured to reject amplified stimulated emission arbitrarily close to each signal passband. It also provides the capability to spectrally shape all the channels using a single component, which could add utility for pre-compensation of FM to AM conversion.

It may be beneficial to modularize the WDM seed beam source into N/M groups of M channels each to seed a set of N high power channels. Modularizing the WDM seed beam source decouples the seed source component powers from the ultimate channel count for the N channel system. The module size M can be selected independently of the system channel count N This flexibility enables use of lower power components in the WDM seed beam source.

Another reason the modularized seed beam source approach may be beneficial is that it also provides flexibility in the wavelength selection plan for the overall laser system. This may be important because as the number of N channels increases to enable higher SBC system powers, the wavelengths of the beams must be spaced closer together to fit within the amplifier gain bandwidth. However, the closer the wavelength channel spacing, the more difficult it is to separate seed beams with low crosstalk. For wavelength $\lambda$ spacings between channels of 0.25 nm (66 GHz), it is difficult to build a bandpass filter with −50 dB crosstalk for neighboring wavelengths while maintaining a flat passband for ~40-50 GHz over which each channel has significant spectral content. By modularizing the WDM seed beam source, the wavelengths can be grouped together with wide channel spacings into the same module while keeping the same narrow channel spacing in the SBC output beam. In this configuration, channel spacings can be increased by a factor of N/M, i.e., by the number of discrete WDM seed source modules. This relaxes isolation and crosstalk requirements and enables scaling to higher channel counts than would otherwise be feasible.

As a specific example of the modularized seed beam source discussed above, consider a typical SBC laser system with a wavelength span from 1040-1080 nm, where the total wavelength span DI is 40 nm. If the source includes N=160 wavelength channels, then the wavelength spacing dI would be DI/N=0.25 nm. If the module size M is eight channels, then the system would have N/M (160/8) or 20 modules. By spectrally interleaving the module outputs, the wavelength spacing can be increased internal to each module to N/M*dI=5 nm. For example, in the first module, the wavelength plan would be {1040, 1045, 1050, 1055, 1060, 1065, 1070, 1075} nm. In the second module, the wavelength plan would be the same, but shifted over by dI; i.e., {1040.25, 1045.25, 1050.25, 1055.25, 1060.25, 1065.25, 1070.25, 1075.25} nm. In this manner, the bandpass filters 42 need only be designed for a 5 nm wavelength spacing instead of a 0.25 nm wavelength spacing.

Figure 4:
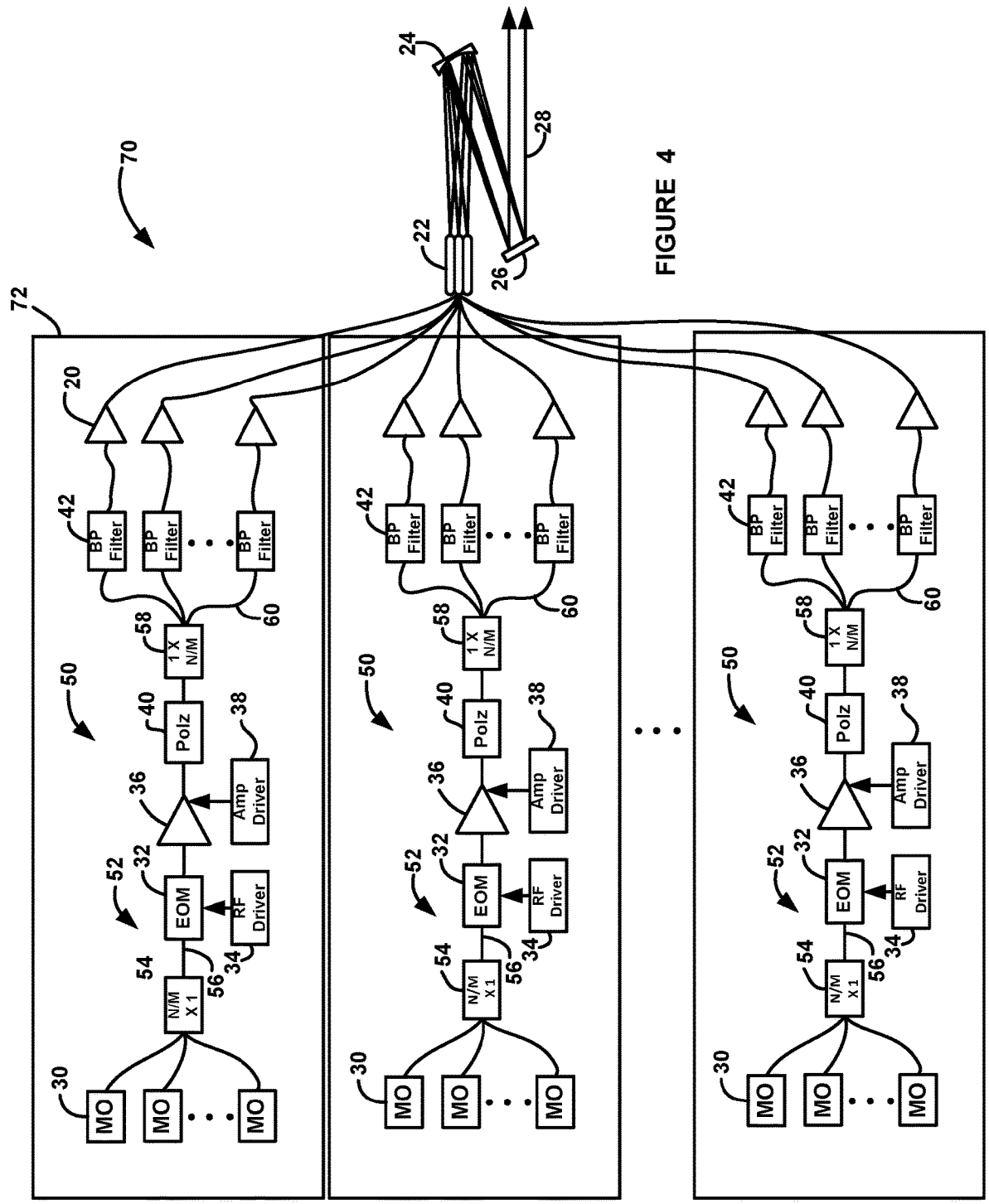
FIG. 4 is a schematic diagram of an SBC fiber laser amplifier system including multiple modularized WDM seed beam sources of the type shown in FIG. 3.

FIG. 4 is a schematic diagram of an SBC fiber laser amplifier system 70 illustrating the modular WDM seed beam source approach discussed above, where like elements to the seed beam source 50 and the fiber laser amplifier system 10 are identified by the same reference number. The system 70 includes M number of wavelength group modules 72 each including N/M number of MOs 30 operating at different wavelengths as discussed above. The spacing between adjacent wavelengths of the seed beams in each module 72 is far enough apart that crosstalk between the channels is not an issue. In the example given above that wavelength spacing is 5 nm. However, the spacing between the wavelengths of the seed beams in different modules 72 may be very close because the filters 42 are in different modules 72, which prevents crosstalk. In the example given above that wavelength $\lambda$ spacing is 0.25 nm. Thus, by using the modularized system 70, N(M−1)/M duplicate sets of components can be eliminated from the known design, with consequent SWaP and cost savings.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A wavelength division multiplexing (WDM) seed beam source comprising:
a plurality of master oscillators each generating a seed beam at a different wavelength on a separate input fiber;
a spectral multiplexer that receives all of the seed beams on the separate fibers and spectrally combines the seed beams onto a common fiber;
an electro-optical phase modulator (EOM) responsive to the combined seed beams on the common fiber, said EOM modulating the combined seed beams by changing the phase of the combined seed beams to be proportional to an applied voltage from an RF driver; and
a spectral demultiplexer responsive to the modulated and combined seed beams on the common fiber and spectrally separating the seed beams onto separate output fibers, wherein the seed beam source is a seed beam source in a spectral beam combining (SBC) fiber laser amplifier system.

2. The seed beam source according to claim 1 wherein the spectral multiplexer and the spectral demultiplexer are a series of add-drop filters, an arrayed waveguide grating (AWG), or a programmable spectral filter with multiple switchable output fibers.

3. The seed beam source according to claim 1 further comprising a plurality of bandpass filters where a separate one of the bandpass filters receives and filters one of the modulated seed beams on one of the output fibers.

4. The seed beam source according to claim 1 further comprising a pre-amplifier that receives the modulated and combined seed beams on the common fiber from the EOM and amplifies the combined seed beams.

5. The seed beam source according to claim 1 further comprising a polarizer that receives the modulated and combined seed beams on the common fiber from the EOM and provides polarization control of the combined seed beams.

6. The seed beam source according to claim 1 wherein the plurality of master oscillators are single-longitudinal mode distributed feedback (DFB) diode laser oscillators.

7. The seed beam source according to claim 1 wherein the fiber laser amplifier system includes a separate fiber amplifier that amplifies the seed beam on each output fiber, an emitter array responsive to all of the amplified beams that directs the amplified beams into free space as diverging uncombined beams, beam collimating optics responsive to the diverging uncombined beams that focuses the diverging uncombined beams as collimated uncombined beams, and an SBC grating responsive to the collimated uncombined beams that spatially combines the collimated uncombined beams so that all of the amplified beams at the different wavelengths are directed in the same direction as an output beam.

8. The seed beam source according to claim 7 wherein the plurality of master oscillators, the spectral multiplexer, the EOM and the spectral demultiplexer are configured as a first seed beam source module in the fiber amplifier system, said fiber amplifier system including a plurality of seed beam modules each having a plurality of master oscillators, a spectral multiplexer, an EOM and a spectral demultiplexer, wherein all of the master oscillators in all of the seed beam source modules operate at different wavelengths.

9. A wavelength division multiplexing (WDM) seed beam source comprising:
a plurality of master oscillators each generating a seed beam at a different wavelength on a separate input fiber;
a spectral multiplexer that receives all of the seed beams on the separate fibers and spectrally combines the seed beams onto a common fiber;
an electro-optical phase modulator (EOM) responsive to the combined seed beams on the common fiber, said EOM modulating the combined seed beams by changing the phase of the combined seed beams to be proportional to an applied voltage from an RF driver;
a pre-amplifier that receives the modulated and combined seed beams on the common fiber from the EOM and amplifies the combined seed beams;
a polarizer that receives the amplified and combined seed beams on the common fiber from the pre-amplifier and provides polarization control of the combined seed beams;
a spectral demultiplexer responsive to the polarization controlled and combined seed beams on the common fiber from the polarizer and spectrally separating the seed beams onto separate output fibers; and
a plurality of bandpass filters where a separate one of the bandpass filters receives and filters one of the modulated seed beams on one of the output fibers.

10. The seed beam source according to claim 9 wherein the spectral multiplexer and the spectral demultiplexer are a series of add-drop filters, an arrayed waveguide grating (AWG), or a programmable spectral filter with multiple switchable output fibers.

11. The seed beam source according to claim 9 wherein the plurality of master oscillators are single-longitudinal mode distributed feedback (DFB) diode laser oscillators.

12. The seed beam source according to claim 9 wherein the seed beam source is a seed beam source in a spectral beam combining (SBC) fiber laser amplifier system.

13. The seed beam source according to claim 12 wherein the fiber laser amplifier system includes a separate fiber amplifier that amplifies the seed beam on each output fiber, an emitter array responsive to all of the amplified beams that directs the amplified beams into free space as diverging uncombined beams, beam collimating optics responsive to the diverging uncombined beams that focuses the diverging uncombined beams as collimated uncombined beams, and an SBC grating responsive to the collimated uncombined beams that spatially combines the collimated uncombined beams so that all of the amplified beams at the different wavelengths are directed in the same direction as an output beam.

14. The seed beam source according to claim 13 wherein the plurality of master oscillators, the spectral multiplexer, the EOM and the spectral demultiplexer are configured as a first seed beam source module in the fiber amplifier system, said fiber amplifier system including a plurality of seed beam modules each having a plurality of master oscillators, a spectral multiplexer, an EOM and a spectral demultiplexer, wherein all of the master oscillators in all of the seed beam source modules operate at different wavelengths.

15. A spectral beam combining (SBC) fiber laser amplifier system comprising:
a wavelength division multiplexing (WDM) seed beam source including a plurality of master oscillators each generating a seed beam at a different wavelength on a separate input fiber, a spectral multiplexer that receives all of the seed beams on the separate fibers and spectrally combines the seed beams onto a common fiber, an electro-optical phase modulator (EOM) responsive to the combined seed beams on the common fiber, said EOM modulating the combined seed beams by changing the phase of the combined seed beams to be proportional to an applied voltage from an RF driver, and a spectral demultiplexer responsive to the modulated and combined seed beams on the common fiber and spectrally separating the seed beams onto separate output fibers;
a plurality of fiber amplifiers each amplifying the modulated seed beam on one of the output fibers;
an emitter array responsive to all of the amplified beams that directs the amplified beams into free space as diverging uncombined beams;
beam collimating optics responsive to the diverging uncombined beams that focuses the diverging uncombined beams as collimated uncombined beams; and
an SBC grating responsive to the collimated uncombined beams that spatially combines the collimated uncombined beams so that all of the amplified beams at the different wavelengths are directed in the same direction as an output beam.

16. The SBC fiber laser amplifier system according to claim 15 wherein the WDM seed beam source is one of a plurality of modularized WDM seed beam sources each having a plurality of master oscillators, a spectral multiplexer, an EOM and a spectral demultiplexer, wherein all of the master oscillators in all of the seed beam source modules operate at different wavelengths.

17. The SBC fiber laser amplifier system according to claim 15 wherein the WDM seed beam source further includes a plurality of bandpass filters where a separate one of the bandpass filters receives and filters one of the modulated seed beams on one of the output fibers.

18. The SBC fiber laser amplifier system according to claim 15 wherein the WDM seed beam source further includes a pre-amplifier that receives the modulated and combined seed beams on the common fiber from the EOM and amplifies the combined seed beams.

19. The SBC fiber laser amplifier system according to claim 15 wherein the WDM seed beam source further includes a polarizer that receives the modulated and combined seed beams on the common fiber from the EOM and provides polarization control of the combined seed beams.

20. A wavelength division multiplexing (WDM) seed beam source comprising:

a plurality of master oscillators each generating a seed beam at a different wavelength on a separate input fiber;

a spectral multiplexer that receives all of the seed beams on the separate fibers and spectrally combines the seed beams onto a common fiber;

an electro-optical phase modulator (EOM) responsive to the combined seed beams on the common fiber, said EOM modulating the combined seed beams by changing the phase of the combined seed beams to be proportional to an applied voltage from an RF driver;

a spectral demultiplexer responsive to the modulated and combined seed beams on the common fiber and spectrally separating the seed beams onto separate output fibers; and a plurality of bandpass filters where a separate one of the bandpass filters receives and filters one of the modulated seed beams on one of the output fibers.

21. A wavelength division multiplexing (WDM) seed beam source comprising:

a plurality of master oscillators each generating a seed beam at a different wavelength on a separate input fiber;

a spectral multiplexer that receives all of the seed beams on the separate fibers and spectrally combines the seed beams onto a common fiber;

an electro-optical phase modulator (EOM) responsive to the combined seed beams on the common fiber, said EOM modulating the combined seed beams by changing the phase of the combined seed beams to be proportional to an applied voltage from an RF driver;

a polarizer that receives the modulated and combined seed beams on the common fiber from the EOM and provides polarization control of the combined seed beams; and a spectral demultiplexer responsive to the modulated and combined seed beams on the common fiber and spectrally separating the seed beams onto separate output fibers.

* * * * *